United States Patent
Carcasi

(10) Patent No.: US 7,435,692 B2
(45) Date of Patent: Oct. 14, 2008

(54) GAS JET REDUCTION OF ISO-DENSE FIELD THICKNESS BIAS FOR GAPFILL PROCESS

(75) Inventor: Michael A. Carcasi, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 236 days.

(21) Appl. No.: 11/254,059

(22) Filed: Oct. 19, 2005

(65) Prior Publication Data
US 2007/0087582 A1    Apr. 19, 2007

(51) Int. Cl.
H01L 21/469    (2006.01)
(52) U.S. Cl. ............... 438/782; 427/240; 257/E21.464
(58) Field of Classification Search ................. 438/758, 438/780, 782, 778; 427/240, 336; 257/E21.464
See application file for complete search history.

(56) References Cited

U.S. PATENT DOCUMENTS

| 5,670,210 | A | 9/1997 | Mandal et al. |
| 5,688,555 | A * | 11/1997 | Teng ............................ 427/240 |
| 5,939,139 | A | 8/1999 | Fujimoto |
| 6,313,044 | B1 | 11/2001 | Lee |
| 6,514,343 | B1 | 2/2003 | Motoda |
| 6,800,569 | B2 | 10/2004 | Ito et al. |
| 6,811,962 | B2 | 11/2004 | Yoshihara et al. |
| 6,817,790 | B2 | 11/2004 | Toshima et al. |
| 2002/0155709 | A1 | 10/2002 | Toshima et al. |
| 2003/0024645 | A1 | 2/2003 | Orii et al. |
| 2003/0118740 | A1 | 6/2003 | Kitano et al. |
| 2003/0207029 | A1 | 11/2003 | Rawat |
| 2004/0253833 | A1 | 12/2004 | Takehiko et al. |
| 2005/0126474 | A1 | 6/2005 | Yoshihara et al. |
| 2005/0175775 | A1 * | 8/2005 | Shirley ....................... 427/240 |

FOREIGN PATENT DOCUMENTS

| EP | 1458015 A2 | 9/2004 |
| JP | 6395626 | 4/1988 |
| JP | 5259054 | 8/1993 |

* cited by examiner

Primary Examiner—Asok K Sarkar
(74) Attorney, Agent, or Firm—Wood, Herron & Evans, L.L.P.

(57) ABSTRACT

A system and method affecting mass transport to reduce or eliminate iso-dense bias in spin-on-dielectric (SOD) or spin-on-glass (SOG) processes use a nozzle to dispense the liquid dielectric and a separate nozzle for jetting $N_2$ or other gas onto a semiconductor wafer. The gas is jetted onto the wafer shortly after spin-on-dielectric liquid is dispensed. The jetting of the gas in the spin-coating process increases the volumetric flow of the liquid coating material in the radial direction, which in turn reduces the field thickness above isolated or no patterned areas to that at the more densely patterned areas, thereby improving the uniformity of the spun-on dielectric thickness on the wafer.

15 Claims, 4 Drawing Sheets

GAS JET REDUCTION OF ISO-DENSE FIELD THICKNESS BIAS FOR GAPFILL PROCESS

This invention relates to the spin coating of semiconductor wafers with dielectric materials in liquid form.

BACKGROUND OF THE INVENTION

Semiconductor devices are typically manufactured by applying layers to semiconductor wafers through a series of deposition and etching steps. The processes appropriate for application of a particular layer often are dictated by, and compatible with, the layers that have been previously applied. At points during the semiconductor manufacturing process, a wafer may have a surface formed of a low dielectric constant dielectric, for example, through which have been etched vias extending through to an underlying conductive layer. These vias or other features will be distributed over the surface of the wafer in varying densities, with areas of dense patterned features and areas of no features or of isolated patterned features or no features. Over such a surface, a dielectric layer of bottom-anti-reflective-material type is commonly applied by a spin-on process. Such layers are referred to as spin-on-glass (SOG) or spin-on-dielectric layers.

Spin-on-dielectric layers are applied by rotating an upwardly facing patterned wafer on a spinning chuck and dispensing the dielectric coating material in liquid form onto the spinning wafer, where it flows from the center toward the edge by centrifugal force, coating the wafer. The liquid material contains a solvent that ultimately evaporates, setting the dielectric layer as a solid film on the substrate. While the objective is to spin the wafer to distribute the film to a uniform thickness by liquid convection, at some point evaporation becomes the dominant mechanism in determining the final dry film thickness profile.

It is found that the final dry film thickness in SOG films varies over the surface of a patterned wafer to which the film is applied. The density of the patterned features on the wafer surface have been found to affect the thickness of the film. In areas where no, or only isolated, features are present on the surface, the film is found to be substantially thicker than in areas where the features are denser. As a result, in a subsequent etch step, patterns that are applied are etched deeper than necessary into the underlying low-constant dielectric in areas of high feature density where the SOG film is thin in order to achieve the etching depth in areas of low feature density where the SOG film is thick. This is a disadvantage. Ideally, the SOG layer should be uniform.

For example, the dynamics of centrifugal force is used to uniformly disperse liquid material over a wafer surface. The wafer may be spinning when the SOG liquid containing the volatile solvent is dispensed (dynamic dispense), or the wafer may be stationary during the dispensing of the liquid (static dispense). In either event, after the liquid is dispensed, the wafer is spun to spread the coating by the mass transfer associated with centrifugal force, liquid convection. During spinning, the casting solvent is rapidly evaporating and the film viscosity is rapidly changing. Evaporation eventually changes the viscosity of the film enough to slow or stop the mass transfer and the film profile is set. Further casting solvent evaporation sets final coat film thickness.

Using a traditional spin coating process with either static or dynamic dispensing of the liquid onto the wafer, spin-on-glass or spin-on-dielectric applications leads to a difference in thickness between areas on the wafer having no patterned features or having only isolated patterned features compared to areas of dense patterned features. In a via-first architecture, this thickness difference, referred to as the iso-dense bias, leads to a decrease resist focus margin, especially during etching with Argon Fluoride (ArF) processes with non-uniform trench heights.

Reduction or elimination of iso-dense bias between areas on the wafer surface of no patterned features or isolated patterned features (blanket thickness) compared to the thickness on areas of dense patterned features would provide more focus process margin during photolithography processes and greater trench depth control during etching processes.

In the conventional single-coat spin-on process discussed above, iso-dense bias is inherent. The only variable historically found to improve iso-dense bias was adjusting solid contents of the spin-on-dielectric or spin-on-glass material. Double-coat spin-on processes have been employed which attempt to use two different chemical formulations with a bake step in between to control iso-dense bias. With the first coat of the double-coat process, gap features are partially filled leaving minimal material in isolated areas (blanket thickness). The second coat, which has flexibility in its solids content, fills the remainder of gap features and defines the blanket thickness. The double-coat process must balance the partial fill ratio of the first coat process with field thickness deposited with the first coat to be successful. The double-coat process is supposed to be capable of better results than single-coat process, but it is more complicated, slower and more costly.

In a process referred to as the scan-coater spin-on process, which is described in U.S. Pat. No. 6,800,569, droplets of chemical are dispensed through a discharge nozzle onto the wafer repetitively, while scanning across the wafer in the x and y directions. Then, the process uses a low pressure cooling dry chamber to evaporate solvent material. This process eliminates radial mass transport, but requires discharge sufficient to fill the most dense pattern areas on the wafer, with no control over iso-dense bias. Further, in a process referred to as the vapor solvent coating process, which is carried out in an SME-solvent mediated environment as described in U.S. Pat. No. 5,670,210, attempts are made to control the evaporation rate of the spun-on material by controlling the vapor pressure above the dispensed film. Its principle is that, by preventing some of the effects of evaporation, the duration of mass transport of the liquid coating by liquid convection diffusion can be extended. In theory, better control of field thickness by mass transport would result. This process controls the evaporation portion of the process, but does not alter whatever iso-dense bias results from the mass transport portion of the process.

Other ways to handle iso-dense bias focus on the addition of subsequent process steps. For example, chemical-mechanical polish has been proposed to level the spun-on film. Additionally, wet-etch back process steps have been added for the same purpose. The addition of extra steps is inherently undesirable as they decrease productivity. Further, each process has the potential of adding defect generation and can be destructive to underlying materials previously deposited on the wafer in the semiconductor manufacturing process.

Accordingly, there is a need for a better and simpler way to eliminate iso-dense bias in spin-on-dielectric processes.

SUMMARY OF THE INVENTION

An objective of the present invention is to overcome or avoid one or more of the problems with spin-on coating processes of the prior art.

Another objective of the present invention is to reduce or eliminate iso-dense bias between areas on a die or wafer having no patterned features or isolated patterned features compared to areas thereon of dense patterned features.

Further objectives of the present invention are to improve the uniformity of spun-on coatings and to focus process margin on the photolithography portion of the semiconductor manufacturing process.

A still further objective of the present invention is to apply spin-on coatings with greater uniformity and to provide greater trench depth control when the spun-on coating is subsequently etched.

According to principles of the present invention, the mass transport portion of a spin-on dielectric process is made more uniform prior to the time when evaporation becomes the dominant mechanism. In particular, the described embodiments of the invention are effective to change the field thickness in the isolated areas.

In accordance with the present invention, a method of spinning a dielectric coating onto a patterned semiconductor wafer is provided in which gas is directed onto a liquid dielectric coating material that has been dispensed onto the wafer so as to affect the mass transport of the liquid on the wafer and the final dry thickness profile of a film formed on the substrate of the dielectric coating material.

More particularly, in accordance with the described embodiments of the invention, a method is provided that comprises dispensing a solvent-containing liquid dielectric coating material onto a semiconductor wafer having areas of no, or relatively low density, patterned features thereon and areas of relatively high density patterned features thereon. The semiconductor wafer is spun to spread the liquid dielectric coating material outward, causing the mass transport of the liquid coating fluid by centrifugal force. Then the solvent is evaporated from the liquid dielectric coating material to set a coating material film on the wafer. While the wafer is being spun and before the coating material film is set, the gas is jetted onto the liquid dielectric coating material that has been dispensed onto the wafer so as to affect the mass transport of the liquid on the wafer so as to level the film thickness profile.

In certain embodiments of the invention, the jetting of the gas includes directing bursts of the gas onto the liquid dielectric coating material. Alternatively, the jetting of the gas can include directing a continuous stream of the gas onto the liquid dielectric coating material from a nozzle while moving the nozzle relative to the center of the wafer. In the described embodiment, the gas is nitrogen.

Further in accordance with certain embodiments of the invention, gas is directed onto the liquid dielectric coating material dispensed onto the wafer before evaporation becomes the dominant mechanism for the final dry film thickness profile. A controller may control the jetting of the gas so as to reduce the iso-dense bias of the film. A controller may also control the jetting of the gas so as to reduce the difference between the thickness of the film at relatively lower density patterned areas on the wafer and the thickness of the film at relatively higher density patterned areas on the wafer.

In the described embodiment of the invention, a separate nozzle is provided on the same arm as the liquid dispensing nozzle and connected to a gas supply line, for example an $N_2$ supply line. The $N_2$ is directed from the nozzle onto the wafer shortly after spin-on-dielectric is dispensed and prior to the time when evaporation becomes the dominant mechanism to the final dry film thickness profile. The jetting of the gas is done either by a short burst of $N_2$ at the center of the wafer only or by a continuous dispense of $N_2$ that scans from the center to the edge of the wafer.

These and other objects and advantages of the present invention will be more readily apparent from the following detailed description of illustrated embodiments of the invention.

DETAILED DESCRIPTION OF THE DRAWINGS

Figure 1:
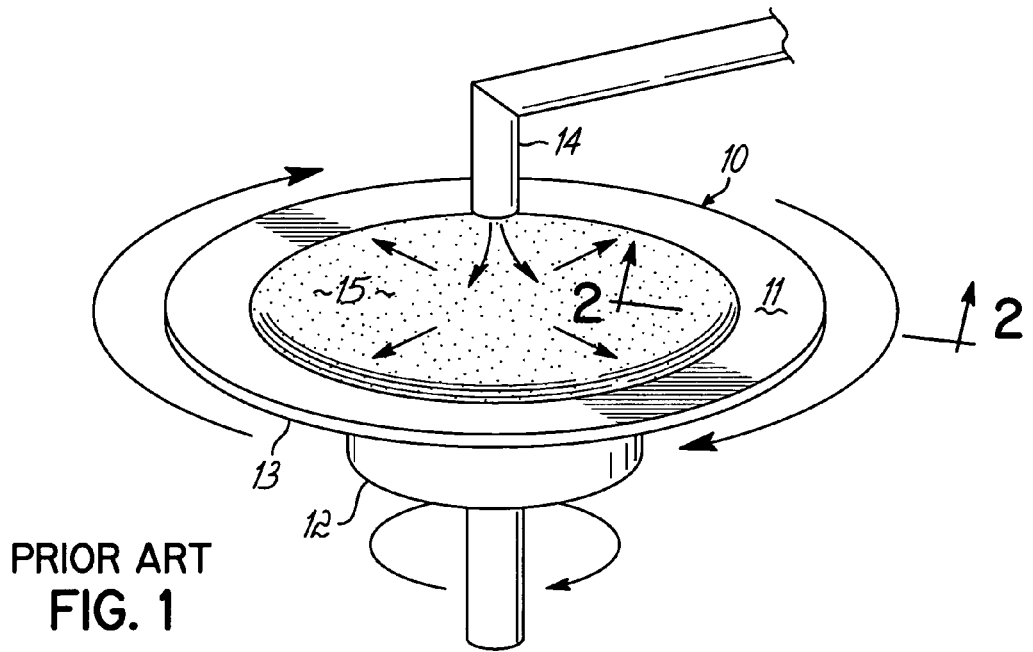
FIG. 1 is a perspective diagrammatic representation of the application of a film to a semiconductor wafer by a spin-on-dielectric process of the prior art.

In a spin-on-dielectric (SOD) or spin-on-glass (SOG) process, a semiconductor wafer 10, having layers of processing on its device surface 11, is centered on an upwardly facing wafer chuck 12 and a liquid dielectric material 15 is dispensed onto the surface 11 from a nozzle 13, as illustrated in FIG. 1. At the time the material 15 is dispensed onto the surface 11, the wafer 10 may be stationary or spinning on the chuck 12. With the material 12 on the surface 11 of the wafer 10, the chuck rotates, spinning the wafer 10, which causes the liquid material 15 to flow radially outward over the surface 11 of the wafer 10 toward the edge 13 of the wafer 10. The liquid material 15 is typically a solvent containing dielectric material that flows radially from the center toward the edge 13 of the wafer by the mechanism of mass transfer associated with centrifugal force, or liquid convection. As the solvent evaporates, the viscosity of the material 15 increases until eventually the evaporation mechanism and its distribution over the wafer surface determines and limits the material flow. Ultimately, the material 15 hardens and assumes a thickness distribution over the surface 11 of the wafer 10. It is typically desired that this thickness distribution be uniform.

Figure 2:
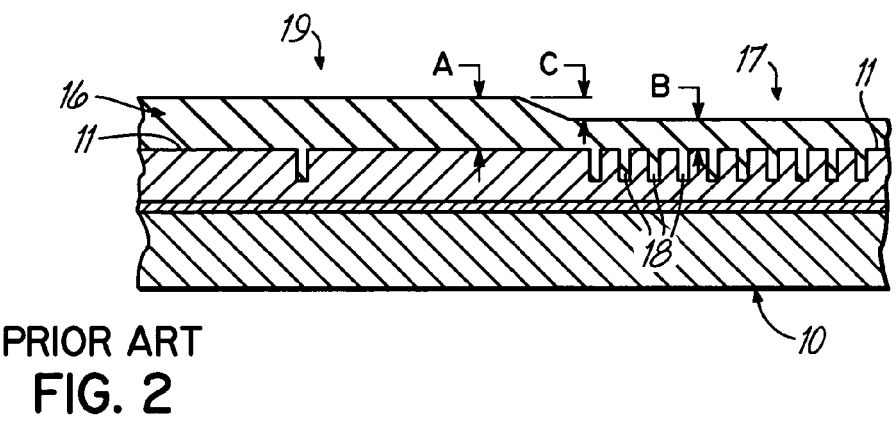
FIG. 2 is a partial side cross-sectional view through the diameter of the wafer of FIG. 1 after application of the film by the process according to the prior art.

In spin-on processes such as illustrated in FIG. 1, the nature of the surface 11 affects the flow of material 12 and the ultimate local thickness of the solidified film 16, as illustrated in FIG. 2. In areas 17 of the surface 11, for example, where there are dense features 18, the thickness of the film 16 tend to a form a film of a particular thickness B, where in areas 19 of no features or only isolated features, the film 16 tends to form at a thickness A that is greater than the thickness B. On wafers 10 on which the features 18 are, for example, high aspect ratio vias, 0.16 micron in diameter, a typical spin-on coating thickness B over areas 17 of high feature density might be 150 nano-meters (nm). On the field areas or isolated feature areas 19, film thickness A might be 250 nm. The thickness difference C between the areas 17 and 19, referred to as iso-dense bias, can adversely affect subsequent processes, particularly making the next etching process difficult.

Figure 3:
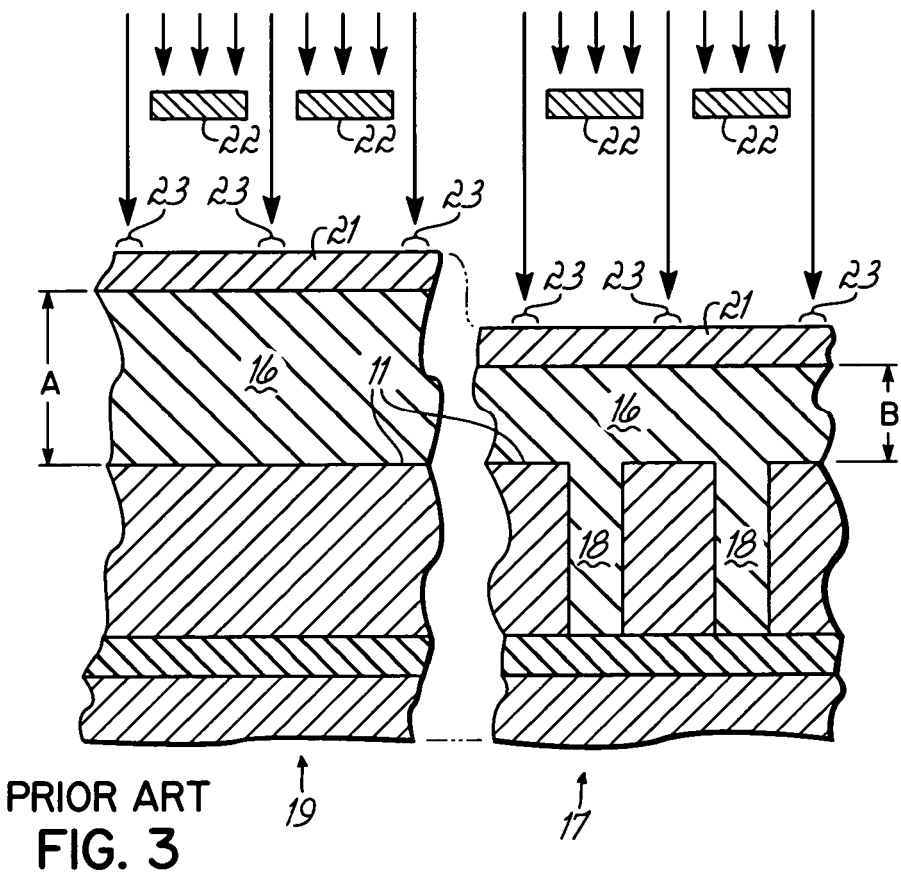
FIG. 3 is an enlarged partial cross-sectional diagram illustrating the application of a photo-resist exposure process following the prior art application of the film of FIGS. 1 and 2.
Figure 4:
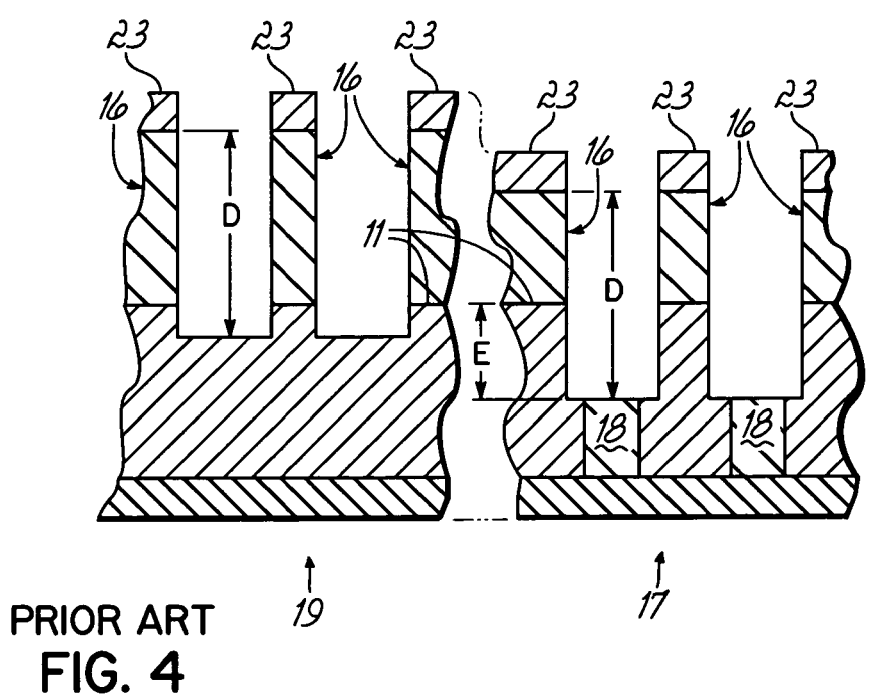
FIG. 4 is an enlarged partial cross-sectional view, similar to FIG. 3, illustrating the effects of the application of an etch process following the application of the photo-resist exposure process of FIG. 3, according to the prior art.

For example, in FIG. 3, sections through the areas 17 and 19 are shown. In the area 19, the thickness A of the spun-on layer 16 is greater than the thickness B of the layer 16 in the area 17. For a the application of a patterned etching process to the spun on layer 16, a layer of photo-resistant material 21 is applied, which is exposed with a pattern through a mask 22, leaving regions 23 where the layer 21 is fixed to resist its removal during a developing step. The developing step leaves the regions 23 coated with the exposed fixed material 21 as illustrated in FIG. 4. Then, in an etching step, material is removed between the regions 23 to a depth D. Because of the coating 16 is thicker by an amount C at areas 19 than at areas 17, the etching step etches deeper into the surface 11 at area 17 than at area 19 by an amount E, which is undesirable.

Figure 5:
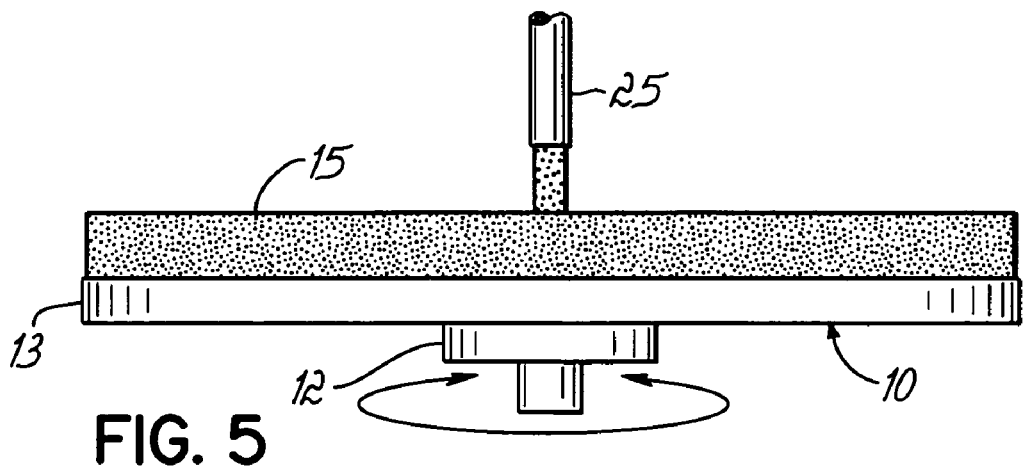
FIG. 5 is a cross sectional view illustrating the dispensing of liquid dielectric onto a wafer for a spin-on-dielectric process according to the present invention.
Figure 6A:
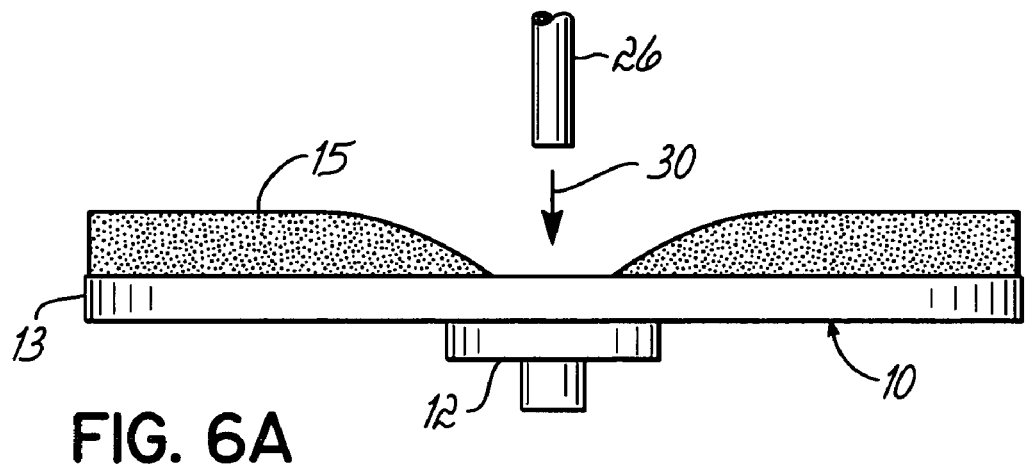
FIG. 6A is a cross sectional view similar to FIG. 5 illustrating a gas jetting step according to one embodiment of the present invention.

The iso-dense bias C is reduced or eliminated by a process performed in accordance with the present invention. One embodiment of the invention is illustrated in FIGS. 5 and 6A. FIG. 5 shows the chuck 12 supporting the wafer 10 and a solvent-containing liquid dielectric coating material 15 being dispensed onto the semiconductor wafer 10 through a coating material nozzle 25. The chuck 12 is rotated to spin the wafer 10 so that the coating material flows toward the wafer edge 13. Then, before evaporation of the solvent within the liquid progresses substantially, a gas 30, for example nitrogen ($N_2$), is jetted from a gas jet nozzle 26 onto the liquid dielectric coating material 15 that has been dispensed onto the wafer 10. The jetting may, for example, be from a nozzle fixed at the center of the wafer 13, as illustrated in FIG. 6A. The nozzle 26 may be mounted on the same arm as the nozzle 25 or may be separately supported.

Figure 7:
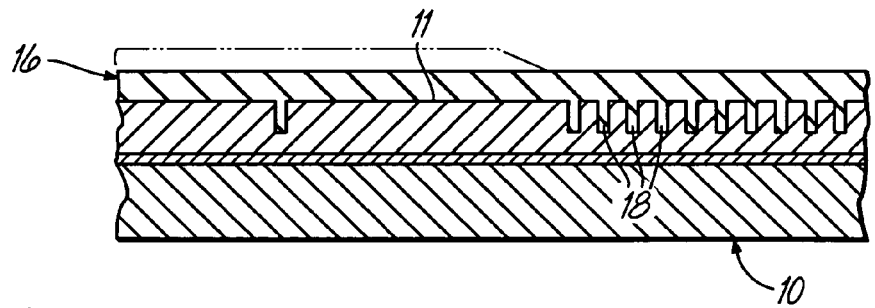
FIG. 7 is a partial cross-sectional view similar to FIG. 2 after application of the film by the process according to the process of FIGS. 5-9 comparing the deposited film with that of the prior art.

The jetting of the gas may be in the form of one or more bursts of gas and is controlled so as to affect the mass transport of the liquid on the wafer and tending to flatten the coating material 15. This flattening is done so as to reduce the thickness A at the areas 19 to approximately equal the thickness B at the areas 17, thereby tending to reduce the difference C between these thicknesses, the iso-dense bias, to as close as practical to zero. Then, when evaporation solidifies the coating material 15, the final dry thickness profile of a film formed on the substrate of the dielectric coating material is approximately uniform, as illustrated in FIG. 7.

Figure 6B:
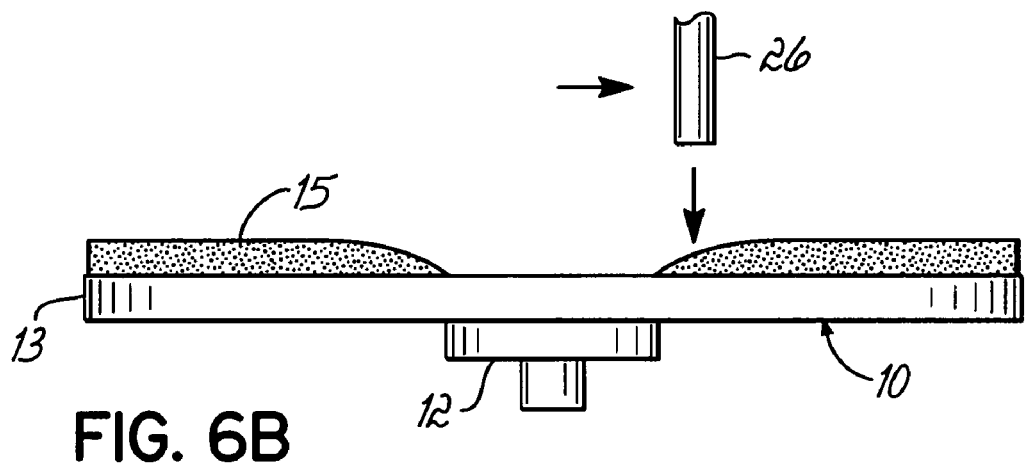
FIG. 6B is a cross sectional view similar to FIG. 6A illustrating a gas jetting step according another embodiment of the present invention.

Alternatively, or in addition, the nozzle 26 may be controlled to move parallel to the surface of the wafer 10 to direct the flow of the liquid 15 toward the wafer edge 13, as illustrated in FIG. 6B. The gas may be made to flow continuously, in bursts as described above, or in such other flow pattern as may be found effective.

Figure 8A:
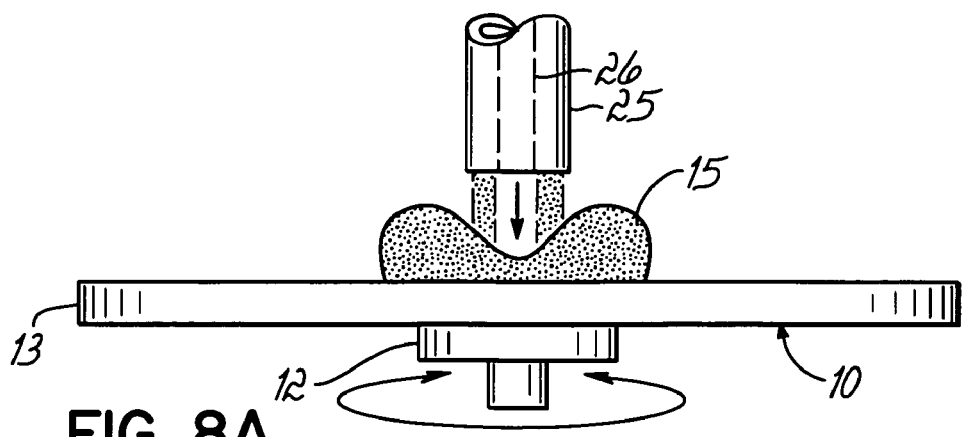
FIGS. 8A and 8B are cross sectional views similar to FIGS. 5 and 6A illustrating dispensing and gas jetting according to another embodiment of the present invention.
Figure 8B:
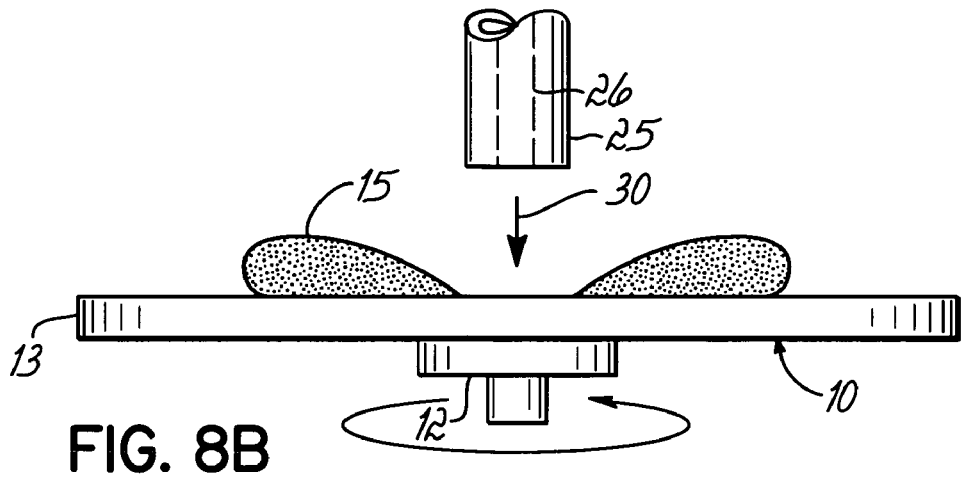

FIGS. 8A and 8B illustrate an embodiment in which the nozzles 25 and 26 are concentric, with the gas jetting nozzle 26 being located at the center surrounded by the dispensing nozzle 25, which is annular. With this embodiment, the coating material can be dispensed from the nozzle 25 and then flattened by gas from the nozzle 26 while the wafer 13 is being spun. Both nozzles are fixed at the center of wafer rotation. This embodiment can reduce the amount of wasted coating material.

Figure 9:
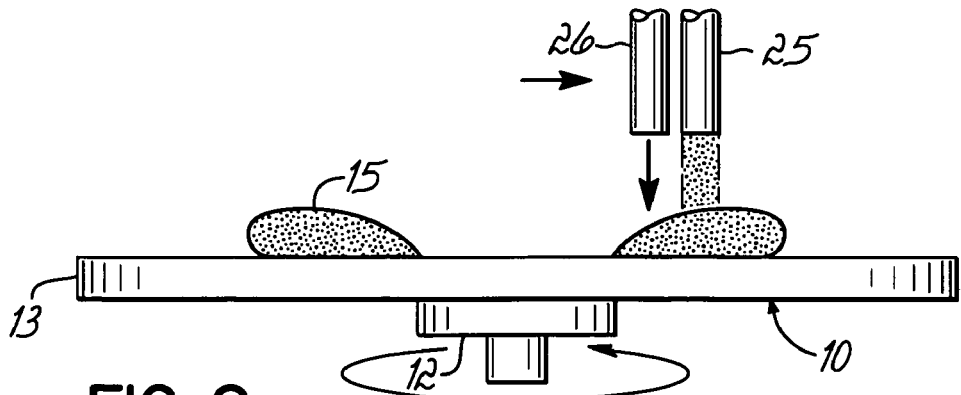
FIG. 9 is a cross sectional view similar to FIG. 6B illustrating dispensing and gas jetting according still another embodiment of the present invention.

Similarly, coating material can be saved with the embodiment of FIG. 9 in which the nozzles 25 and 26 are located adjacent each other on the same arm. Coating material is dispensed from nozzle 25 and gas is jetted from nozzle 26 as the wafer 13 is being spun and as the nozzles move from the center of the wafer 13 to its rim, with the gas flattening the coating material immediately as it is dispensed.

The invention attempts to affect the mass transport prior to the time when evaporation becomes the dominant mechanism in order to change the field thickness in the isolated die areas. The gas flow is used to reduce and possibly eliminate the iso-dense bias between areas on the die of no patterned features or isolated patterned features (blanket thickness) compared to areas of dense patterned features and thus give more focus process margin at photolithography and greater trench depth control at etch.

When calculating mass transport in traditional spin coating, these boundary conditions are defined: 1) the radial velocity of the liquid coating material is equal to zero at wafer-liquid interface, that is, the liquid 14 does not slip at wafer surface; and 2) the gas exerts negligible shear stress at liquid-gas boundary. These boundary conditions, with no other significant external force applied, result in the shear forces within the liquid coating material ultimately limiting the final thickness to a product of its dispensed initial thickness, the angular velocity of the rotating wafer 10, the density of the material 15, its viscosity, and time.

In order to affect mass transport, the $N_2$ or other gas is directed onto the wafer shortly after spin-on-dielectric or spin-on-glass is dispensed, usually within the first five seconds after the coating material 14 is dispensed and prior to the time when evaporation becomes the dominant mechanism to the final dry film thickness profile. The addition of the jetted gas in the spin-coating process increases the volumetric flow in the radial direction, which in turn reduces the field thickness above isolated or no patterned areas 19.

Process parameters such as the height of the gas nozzle 26 from the wafer 10, the nozzle dimensions, the $N_2$ or other gas flow rate, the timing of the gas flow (e.g., burst versus continuous jetting versus other), gas nozzle motion, jetted gas stream angle relative to wafer surface, and scan rate, etc., can be determined empirically based on the properties of the coating material 15, the wafer surface, and other conditions.

Traditional spin-on processes, such as the single coat and double coat spin-on processes, are based on the strong coupling between the mass transfer mechanism of convective diffusion and the solvent evaporation mechanism of the material 15. This coupling ultimately determines the thickness uniformity profile on the wafer and die level. Neither the single coat nor the double coat techniques attempt to change either aspect of this coupled relationship.

The scan coat process eliminates the coupled relationship such that there is essentially no radial mass transport, with evaporation being carried out separately. However, since there is no radial mass transport, the iso-dense biased and field thickness is based on dispensing the minimum amount of thickness required to fill the most dense pattern areas on the die and hence there is no control over iso-dense bias.

The vapor scan coat technique attempts to change the coupled convective diffusion-solvent evaporation relationship. It changes the solvent evaporation component of the relationship rather than the mass transport (convective diffusion) component as the invention does.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of spinning a dielectric coating onto a patterned semiconductor wafer having a center and a circular edge, the method comprising:
   dispensing a solvent-containing liquid dielectric coating material onto and near the center of an upwardly facing semiconductor wafer having areas of no, or a relatively low density of, patterned features thereon and areas having a relatively high density of patterned features thereon;
   spinning the semiconductor wafer to spread the liquid dielectric coating material outward from the center toward the edge;
   evaporating solvent from the liquid dielectric coating material to set a coating material film on the wafer; and
   while the wafer is spinning and before the coating material film is set, jetting gas generally downwardly toward and onto the liquid dielectric coating material that has been dispensed onto the wafer so as to affect the mass transport of the liquid on the wafer and thereby dry the final thickness profile of a film formed on the substrate of the dielectric coating material, the jetting of the gas including either:
      directing the gas axially downwardly from a fixed location at the center of the wafer, or
      impinging the gas onto the wafer near the center of the wafer, then progressing from the center of the wafer outwardly toward the edge of the wafer,
   so as to reduce the thickness of the film by the jetted gas and to transport the film outwardly ahead of the jetted gas toward the edge of the wafer.

2. The method of claim 1 wherein:
   the jetting of the gas includes directing bursts of the gas onto the liquid dielectric coating material.

3. The method of claim 1 wherein:
   the jetting of the gas includes directing a continuous stream of the gas onto the dispensed liquid dielectric coating material from a nozzle while moving the nozzle radially outward from the center of the wafer to the edge of the wafer.

4. The method of claim 1 wherein:
   the gas is nitrogen.

5. The method of claim 1 wherein:
   the gas is jetted onto the liquid dielectric coating material dispensed onto the wafer before evaporation becomes the dominant mechanism for the final dry film thickness profile.

6. The method of claim 1 further comprising:
   controlling the jetting of the gas so as to reduce the iso-dense bias of the film.

7. The method of claim 1 further comprising:
   controlling the jetting of the gas so as to reduce the difference between the thickness of the film at relatively lower density patterned areas on the wafer and the thickness of the film at relatively higher density patterned areas on the wafer.

8. The method of claim 1 wherein:
   the film is spun-on-glass.

9. An apparatus for performing the method of claim 1.

10. A method of applying spun-on dielectric film to a patterned semiconductor wafer having a center and a circular peripheral edge, comprising:
    providing a spin coating apparatus having a rotatable wafer supporting chuck having an upwardly facing wafer supporting surface, an inlet connectable to a supply of liquid dielectric, a first nozzle above the wafer supporting surface that is connected to the inlet and directed toward the wafer supporting surface, a second nozzle above the wafer supporting surface that is connectable to a source of gas and directed generally downwardly toward the wafer supporting surface, and a controller coupled to the chuck and the nozzles and operable:
       to cause the first nozzle to dispense liquid dielectric from the liquid dielectric supply onto a wafer supported on the wafer supporting surface,
       to cause the chuck to rotate to spin the wafer and thereby cause the liquid dielectric that has been dispensed onto the wafer to flow radially outwardly on the wafer, and
       to cause the second nozzle to jet gas from the gas supply downwardly at the approximate center of the wafer, against and onto liquid dielectric flowing on the wafer to flatten the liquid dielectric and urge the liquid dielectric to flow radially outwardly from the center to the edge on the wafer,
       to thereby control iso-dense bias of dielectric film coating on the wafer.

11. The method of claim 10 further comprising:
    providing the controller configured to cause the second nozzle to jet a burst of the gas onto liquid dielectric flowing on the wafer.

12. The method of claim 10 further comprising:
    providing the controller configured to cause the second nozzle to jet a continuous flow of the gas onto liquid dielectric flowing on the wafer.

13. The method of claim 10 wherein:
    the second nozzle is moveable radially parallel to the surface of the wafer supporting surface from the center to near the edge of the wafer; and
    the controller is operable to cause the second nozzle to move radially relative to the wafer while causing the second nozzle to jet the gas onto liquid dielectric flowing on the wafer to urge the liquid coating material to flow radially outwardly from the radially moving second nozzle.

14. The method of claim 1 wherein the jetting of the gas includes:
    directing the gas axially downwardly from a fixed location at the center of the wafer.

15. The method of claim 1 wherein the jetting of the gas includes:
    impinging the gas onto the wafer near the center of the wafer, then progressing from the center of the wafer outwardly toward the edge of the wafer, to transport the film outwardly ahead of the jetted gas toward the edge of the wafer.

* * * * *